US008673660B2

(12) United States Patent
Yonemoto

(10) Patent No.: US 8,673,660 B2
(45) Date of Patent: Mar. 18, 2014

(54) METHOD OF PRODUCING LIQUID EJECTION HEAD

(75) Inventor: Taichi Yonemoto, Isehara (JP)

(73) Assignee: Canon Kabushiki Kaisha, Tokyo (JP)

(*) Notice: Subject to any disclaimer, the term of this patent is extended or adjusted under 35 U.S.C. 154(b) by 91 days.

(21) Appl. No.: 13/348,177

(22) Filed: Jan. 11, 2012

(65) Prior Publication Data

US 2012/0199550 A1 Aug. 9, 2012

(30) Foreign Application Priority Data

Feb. 7, 2011 (JP) ................................. 2011-023736

(51) Int. Cl.
*H01L 21/00* (2006.01)

(52) U.S. Cl.
USPC ............. 438/21; 438/689; 438/690; 438/691; 347/20; 347/41; 347/84; 347/85

(58) Field of Classification Search
None
See application file for complete search history.

(56) References Cited

U.S. PATENT DOCUMENTS

2006/0139409 A1* 6/2006 Matsushita et al. ............. 347/55
2007/0200877 A1* 8/2007 Arakawa ........................... 347/1
2008/0076197 A1* 3/2008 Komuro et al. ................. 438/21

FOREIGN PATENT DOCUMENTS

JP 2007-160625 A 6/2007

* cited by examiner

*Primary Examiner* — Duy Deo
(74) *Attorney, Agent, or Firm* — Fitzpatrick, Cella, Harper & Scinto

(57) ABSTRACT

Provided is a method of producing a liquid ejection head substrate, the method including, in sequence; grinding a second surface of a silicon substrate, which is an opposite surface of a first surface on which a function element is formed, polishing the ground second surface, etching the polished second surface by reactive ion etching using ion incident energy, forming an etching mask on the second surface after the reactive ion etching, and forming a liquid supply port by subjecting the silicon substrate to wet etching using the etching mask.

9 Claims, 4 Drawing Sheets

METHOD OF PRODUCING LIQUID EJECTION HEAD

BACKGROUND OF THE INVENTION

1. Field of the Invention

The present invention relates to a method of producing a liquid ejection head.

2. Description of the Related Art

Generally, an ink jet recording head applied to an ink jet recording system includes a fine ejection orifice, a liquid flow path, and an ejection energy generating element provided in part of the liquid flow path. A known example of a method of producing the ink jet recording head is a method described in Japanese Patent Application Laid-Open. No. 2007-160625.

In the production method disclosed in Japanese Patent Application Laid-Open. No. 2007-160625, first, an ink flow path is formed on a substrate by photolithography technology, and then the rear surface is subjected to grinding or polishing, followed by forming an etching mask from a double layer of a metal oxide film and an organic resin film. After that, an ink supply port is formed by chemical etching from the rear surface of the substrate, thereby producing an ink jet recording head.

However, the method described in Japanese Patent Application Laid-Open. No. 2007-160625 uses, as an etchant for chemical etching of silicon, a very highly reactive chemical, such as tetramethylammonium hydroxide (TMAH), KOH, HF, and $HNO_3$. The etching mask is therefore required to have high chemical resistance so as not to be impervious to such chemicals. However, in order to form a film having high chemical resistance, it is generally necessary to form the film at high temperature of about 300° C. or more in either case of an inorganic film or an organic film.

Meanwhile, in order to thin the silicon substrate, the silicon substrate is subjected to grinding to a thickness of 80 μm, for example, by a machine or the like. At this time, a crushed layer (affected layer) is generated on the ground surface of the silicon substrate. Conventionally, the affected layer is removed by polishing, wet etching, or other methods.

However, the method of removing a crushed layer by wet etching cannot control the shape of a peripheral end portion of a wafer and may lower the covering property (coverage) of an organic film.

To address the problem, the method of removing a crushed layer by polishing has been proposed in the conventional method. However, in the case of removing a crushed layer by polishing, the crystal structure may be damaged by polishing and crystal distortion may occur in the polished surface. If a damaged layer including crystal distortion is present on an etching surface, when an ink supply port is formed by anisotropic etching, the etching may progress irregularly because of the damaged layer, with the result that the ink supply port may be formed into an abnormal shape.

In the conventional method, a method of removing a crushed layer by dry etching has also been proposed. However, in the method of removing a crushed layer by dry etching, depending on gas species or the type, the rate of etching the crushed layer may be accelerated or surface deposition may occur, which enlarges a grinding mark generated during grinding. If the grinding mark is larger, the film forming property of the surface is lowered, and thus the mask performance of the etching mask may be lowered.

Further, when the grinding mark is removed by an etchant to flatten the surface, the bevel profile of a peripheral portion of the silicon substrate may be distorted. As a result, the covering property of the etching mask used for crystal anisotropic etching may be lowered at the peripheral portion of the silicon substrate, and thus the peripheral portion of the silicon substrate may be fractured by etching.

Further, when the grinding mark or the crushed layer is removed by polishing to flatten the surface, a damaged layer is generated. In the case where the damaged layer is removed by a chemical dry etching apparatus, the etching rate increases selectively at a portion of the damaged layer where damage occurs. Examples of the damage include crystal distortion and a polishing mark.

SUMMARY OF THE INVENTION

It is therefore an object of the present invention to provide a method of producing a liquid ejection head substrate, which is capable of satisfactorily removing a damaged layer on a silicon substrate surface so as to improve covering property of an etching mask and is thus capable of forming a liquid supply port with high precision. The present invention provides a method of producing a liquid ejection head substrate including a silicon substrate having a function element and a liquid supply port, the method including, in the following order, the steps of grinding a second surface of a silicon substrate, which is an opposite surface of a first surface on which a function element is formed, polishing the ground second surface, etching the polished second surface by reactive ion etching using ion incident energy, forming an etching mask on the second surface after the reactive ion etching, and forming a liquid supply port by subjecting the silicon substrate to wet etching using the etching mask.

Further features of the present invention will become apparent from the following description of exemplary embodiments with reference to the attached drawings.

BRIEF DESCRIPTION OF THE DRAWINGS

FIG. 3B is a cross-sectional view taken along line 3B-3B in FIG. 3A. FIG. 3C is a cross-sectional view taken along line 3C-3C in FIG. 3A.

DESCRIPTION OF THE EMBODIMENTS

Figure 1A:
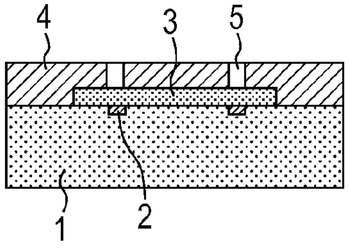
FIGS. 1A, 1B, 1C, 1D, 1E, 1F, 1G, 1H, 1I and 1J are cross-sectional views illustrating the steps of a method of producing a liquid ejection head substrate according to a first embodiment of the present invention.

Hereinafter, referring to the drawings, embodiments of the present invention are described.

Note that, in the following description, an ink jet head substrate is exemplified as an application example of the present invention, but the application range of the present invention is not limited thereto. In addition to the ink jet head substrate, the present invention is also applicable to a method of producing a liquid ejection head substrate for use in the production of biochips and the printing of electronic circuits. Examples of the liquid ejection head include an ink jet recording head as well as a color filter producing head.

(First Embodiment)

An ink jet head substrate produced in a first embodiment of the present invention is mainly constituted by a silicon substrate on which a function element is formed on a first surface side. An example of the function element includes an ejection energy generating element. However, the present invention is not particularly limited thereto. FIGS. 1A to 1J illustrate a silicon substrate 1 on which ejection energy generating elements 2 are formed and arranged at predetermined pitches in two rows. In the silicon substrate 1, an ink supply port 12, which is formed by anisotropic etching of silicon, is formed so as to be opened between the two rows of the ejection energy generating elements 2. On the silicon substrate 1, by means of a flow path pattern member 3, there are formed ink ejection orifices 5, which are opened above the respective ejection energy generating elements 2, and individual ink flow paths, which communicate from the ink supply port 12 to the respective ink ejection orifices 5.

This ink jet recording head is disposed so that the surface having the ink supply port 12 formed therein may be opposed to a recording surface of a recording medium. In the ink jet recording head, ink is loaded in the flow path through the ink supply port 12. By applying pressure generated by the ejection energy generating element 2 to the ink, ink droplets are ejected from the ejection orifice 5, and the ink droplets are caused to adhere onto the recording medium, thereby performing recording.

This ink jet recording head is mountable on such apparatus as a printer, a copying machine, a facsimile machine, and a word processer including a printer portion, as well as an industrial recording apparatus incorporating various processing apparatus in multiple combinations.

FIGS. 1A to 1J are cross-sectional views illustrating the steps of an exemplary method of producing an ink jet head substrate according to the first embodiment.

First, as illustrated in FIG. 1A, the silicon substrate 1 on which the ejection energy generating elements 2 are formed on the first surface (front surface) is prepared. Then, on the silicon substrate 1, the flow path pattern member 3 to be a pattern of the ink flow path is formed using a positive type resist or the like. Further, a flow path forming member 4 is formed on the flow path pattern member 3, and the ink ejection orifices 5 are formed in the flow path forming member 4.

Figure 1B:
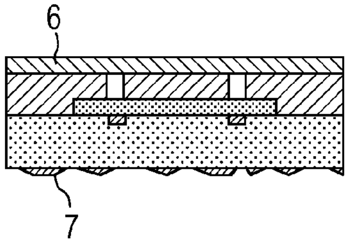

FIG. 1B illustrates the state after the step of FIG. 1A, in which a protective film 6 is formed and a second surface (rear surface) of the silicon substrate 1 on the opposite side of the first surface is subjected to grinding. A crushed layer 7 or a grinding mark (not shown) is generated on a ground surface of the silicon substrate 1.

Figure 1C:
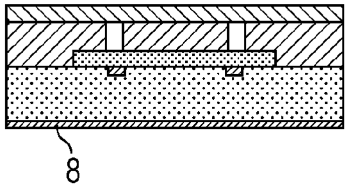

FIG. 1C illustrates the state after the step of FIG. 1B, in which the crushed layer 7 or the grinding mark is removed by polishing. The crushed layer 7 or the grinding mark is removed by polishing, and thus the ground surface is flattened. On the other hand, a damaged layer 8 including crystal distortion and polishing marks is generated on the silicon substrate surface after polishing (polished surface). An example of the polishing includes dry polishing.

Figure 1D:
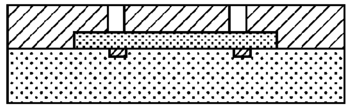

FIG. 1D illustrates the state after the step of FIG. 1C, in which the polished surface is processed by reactive ion etching using ion incident energy to remove the damaged layer 8. By reactive ion etching, ions generated using plasma are caused to impinge on the polished surface, to thereby remove the damaged layer 8. The use of reactive ion etching using ion incident energy provides an advantage that etching with high verticality is possible to remove the crushed layer and flatten the unevenness of polishing marks.

An example of the reactive ion etching using ion incident energy includes a capacitively coupled plasma (CCP) method, in which a high-frequency power supply is connected to two opposing electrodes disposed in a vacuum chamber. Another example is an inductively coupled plasma (ICP) method, in which a high-frequency power supply is connected to a coil disposed so as to surround a vacuum chamber. In reactive ion etching using ion incident energy, plasma is obtained by applying electromagnetic waves to an etching gas in a reaction chamber, and a negative voltage is applied to an etching target, so that ionic species or radical species in the plasma are accelerated and caused to impinge on the etching target, thereby performing etching.

It is preferred that the reactive ion etching uses, as a gas species, at least one kind selected from $SF_6$, $CHF_3$, $CF_4$, $C_2F_6$, and $C_3F_8$ which are used in Si dry etching.

An etching pressure in reactive ion etching is preferred to be 1 to 100 Pa. Etching in a low-vacuum environment has stronger verticality and provides advantages in that crystal distortion and polishing marks are efficiently removed to flatten the surface and the shape of a peripheral portion of a wafer is less affected by etching.

Figure 1E:
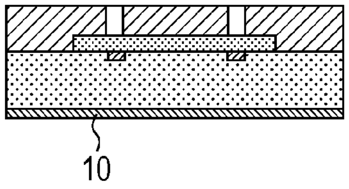

FIG. 1E illustrates the state after the step of FIG. 1D, in which a polyamide resin 10 is disposed on the second surface (rear surface) of the silicon substrate. The polyamide resin 10 can be disposed on the substrate rear surface by spin coating application and drying, for example.

Figure 1F:
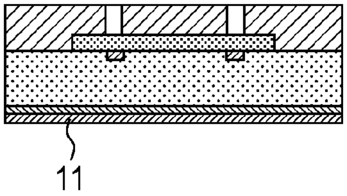

FIG. 1F illustrates the state after the step of FIG. 1E, in which a positive type resist 11 is disposed on the polyamide resin 10. The positive type resist 11 can be disposed by spin coating application and drying, for example.

Figure 1G:
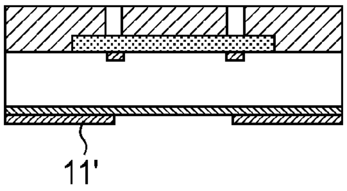

FIG. 1G illustrates the state after the step of FIG. 1F, in which the positive type resist 11 is patterned to form a first mask 11'. The pattering of the positive type resist 11 can be performed by exposure and development.

Figure 1H:
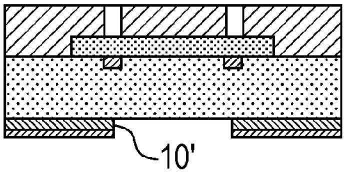

FIG. 1H illustrates the state after the step of FIG. 1G, in which the polyamide resin 10 is patterned using the first mask 11' to form a second mask 10'. The patterning of the polyamide resin 10 can be performed by etching using a dry etcher, for example. The second mask 10' serves as an etching mask for forming the ink supply port 12.

Figure 1I:
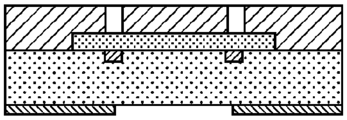

FIG. 1I illustrates the state after the step of FIG. 1H, in which the first mask 11' is removed.

Figure 1J:
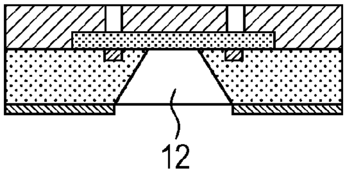

FIG. 1J illustrates the state after the step of FIG. 1I, in which the ink supply port 12 is formed by performing wet etching using the second mask 10', namely the etching mask. As the wet etching for forming the ink supply port 12, crystal anisotropic etching of silicon is preferred.

According to the present invention, the damaged layer on the silicon substrate surface can be removed satisfactorily, to thereby improve the covering property of the etching mask. Thus, a liquid supply port can be formed with high precision.

Note that, the etching mask may be formed at the final stage of the production process, namely after the flow path pattern member and the flow path forming member are formed on the front surface of the silicon substrate. In this case, the etching mask can be prevented from being damaged during the process flow.

Further, according to the present invention, the damaged layer 8 (crystal distortion layer) and the polishing marks are removed by reactive ion etching (RIE) using ion incident energy, and hence the unevenness on the substrate rear surface is eliminated, and thus the etching mask can be formed satisfactorily.

Examples of the grinding method include, but not particularly limited to, grinding using a grinding stone and mechanical polishing using relative motion between an abrasive and a polishing target.

Examples of the polishing method include, but not particularly limited to, chemical polishing including etching and a method called dry polishing that uses a grinding stone for polishing. It is desired that polishing be performed in consideration of the polishing amount and the polished surface roughness based on the depth of a flaw in the rear surface, the density of oxidation stacking faults (OSF), and the width of the ink supply port. The surface roughness (Ra) of the polished surface is 8 to 20 Å, for example.

The state illustrated in FIG. 1B is an example in which backgrinding is performed.

The state illustrated in FIG. 1C is an example in which dry polishing is performed. Polishing has the purpose of removing a grinding mark or a crushed layer generated during grinding and flattening the surface. By performing polishing, a peripheral end portion of the silicon substrate 1 can be processed into a shape that does not affect the covering property of the etching mask.

The second surface after polishing (polished surface) is finished to have a surface roughness (Ra) smaller than that of the second surface after grinding (ground surface).

After the reactive ion etching, a plasma ashing process using $O_2$ may be performed. By performing the plasma ashing process, for example, when an etching mask is formed using a cyclized rubber-based resin or a polyamide resin, the influence of a dust flaw in the second surface after the reactive ion etching can also be reduced. Thus, the etching mask property can be improved.

As an etchant used for wet etching of the silicon substrate for forming the ink supply port, an alkaline etchant can be used, for example. Examples of the etchant include a KOH solution, a NaOH solution, and a tetramethylammonium hydroxide (hereinafter, also referred to as TMAH) solution. As the material for the etching mask, an etchant-resistant material is used.

An example of the material for the etching mask that can be used includes, but not particularly limited to, an inorganic film. Specific examples of the inorganic film include a silicon oxide ($SiO_2$) and a silicon nitride (SiN). Examples of the silicon oxide film forming method include thermal oxidation and sputtering. An example of the silicon nitride film forming method includes plasma CVD.

As the material for the etching mask, it is preferred to use a polymer compound. Examples of the polymer compound include cyclized rubber, polyether amide, and benzocyclobutene. With the use of those resins, the etching mask can be formed without affecting the flow path pattern member and the flow path forming member and so as to be satisfactorily brought into intimate contact with the second surface from which the damaged layer 8 including a crystal distortion layer and a polishing mark has been removed.

Hereinafter, the present invention is described more specifically. Note that, the present invention is not intended to be limited to the following example.

Example 1 exemplifies the production of an ink jet recording head using a thermal resistance element as an ejection energy generating element, that is, a so-called bubble jet recording type ink jet recording head.

The illustrated drawings are cross-sectional views of a single ink jet recording head. In semiconductor manufacturing technology, it is general that the same multiple elements are arrayed on the silicon substrate 1 and multiple pieces are obtained therefrom. It should be understood that multiple ink jet recording heads of this embodiment can be obtained from the silicon substrate 1 similarly.

In this example, an ink jet recording head is produced through the steps illustrated in FIGS. 1A to 1J.

The silicon substrate 1 has a surface with a crystal orientation of <100>, and a driving element for driving the ejection energy generating element 2 is formed by the semiconductor manufacturing technology. Further, an electrical extraction electrode used for the ejection energy generating element 2 and an external control device is also formed.

The flow path pattern member 3 is formed by photolithography technology using a resin that is removable by dissolution. As the dissolvable resin, for example, a positive type photoresist PMER-AR900 (trade name, produced by TOKYO OHKA KOGYO CO., LTD.) can be used.

The flow path forming member 4 including the ink ejection orifice 5 is formed by photolithography technology. As the flow path forming member 4, for example, a photosensitive epoxy resin or a photosensitive acrylic resin can be used.

The flow path forming member 4 is always brought into contact with ink as an ink jet recording head. It is therefore desired to select the material for the flow path forming member 4 in consideration of the following points. First, the material needs to be free from elution of impurities when the material contacts with ink. Further, the material needs to have high adhesion with the silicon substrate and be free from peeling-off even after the elapse of time. In view of those points, a photo cationic polymerizable compound is suitable for the flow path forming member 4. Note that, it is desired to select the material for the flow path forming member 4 so as to meet the purpose of an ink liquid to be used.

For grinding, for example, a Fully Automatic Grinder (manufactured by DISCO Corporation) using a grinding stone having a particle diameter of #2000 can be used, with a processing amount of 100 μm and a surface roughness (Ra) of about 73 Å.

The material for the protective film 6 is not particularly limited as long as the material can be removed easily after the end of polishing and does not affect the function element. The protective film 6 can be formed by applying a cyclized rubber-based resin by spin coating, for example. Alternatively, as the protective film 6, for example, a Mylar film, which is generally known as protective tape for a silicon substrate, or a polyolefin film having an adhesive applied thereon can be used. Those films are commercially available. More specifically, for example, in view of the ease of removal after polishing, an ELEP HOLDER UE-series (manufactured by NITTO DENKO CORPORATION), which is lowered in pressure-sensitive adhesiveness when irradiated with ultraviolet rays, can be used.

For polishing, for example, the Fully Automatic Grinder (manufactured by DISCO Corporation) can be used, with a processing amount of 2 μm and a surface roughness (Ra) of 50 Å. The grinding mark or the crushed layer can be removed by polishing of 1 to 20 μm, for example. Generally, the surface can be flattened by polishing of 1 μm, and can be completely flattened by a processing amount of 2 μm.

Polishing also flattens the peripheral end portion of the silicon substrate, which improves the covering property of a resin applied as an etching mask.

Reactive ion etching can be performed using AMS200 (trade name, Alcatel Micro Machining Systems), with an etching gas of $SF_6$. Regarding the removal amount of the silicon substrate by reactive ion etching, about 5 μm is enough to remove the damaged layer 8.

(Comparison)

FIGS. 4A to 4I illustrate an example of producing an ink jet recording head by performing dry etching having chemical etching property for the removal of the damaged layer 8. This comparative case is different from the case of FIGS. 1A to 1J in that the damaged layer 8 is removed using dry etching having chemical etching property.

Figure 4A:
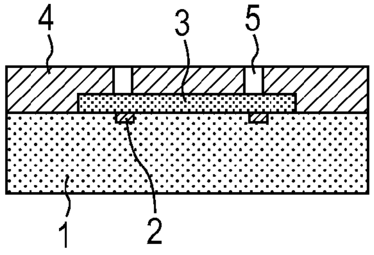
FIGS. 4A, 4B, 4C, 4D, 4E, 4F, 4G, 4H and 4I are cross-sectional views illustrating the steps of a conventional method of producing an ink jet recording head.
Figure 4B:
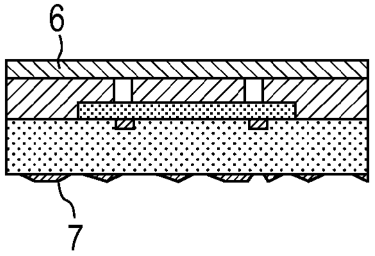
Figure 4C:
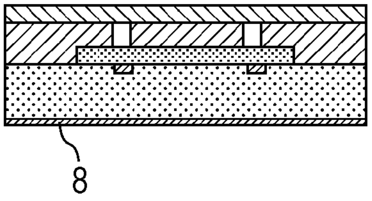
Figure 4D:
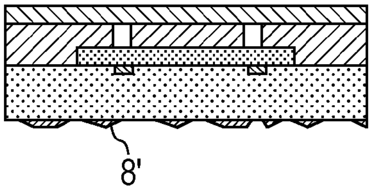
Figure 4E:
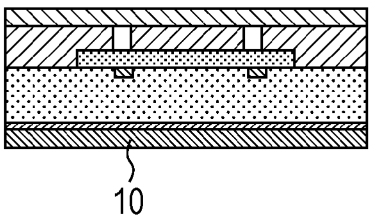
Figure 4F:
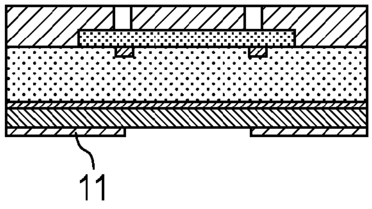
Figure 4G:
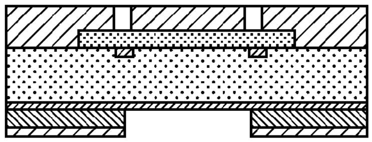
Figure 4H:
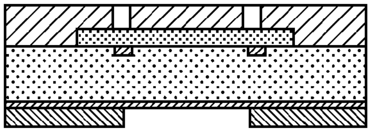

FIG. 4C corresponds to the state of FIG. 1C (the state of FIG. 1C is after the removal of the crushed layer and the like by polishing). FIG. 4D illustrates the state after the state of FIG. 4C, in which the polished surface is processed by dry etching having chemical etching property.

The term "chemical etching property" as used herein means a property with which the material on the wafer surface may be changed to a volatile material through chemical reaction with an active gas so that the material may be removed from the wafer. On the other hand, reactive ion etching used in the present invention is etching for flattening the unevenness on the substrate surface by physical impact using ion incident energy.

For dry etching having high chemical etching property, for example, an apparatus with high chemical etching property, CDE-7 (trade name, manufactured by SHIBAURA MECHATRONICS CORPORATION), can be used, with an etching gas of $CF_4$. The removal amount can be set to about 5 μm, for example, as suggested in Example 1.

Figure 4I:
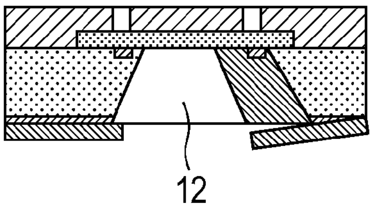

However, if dry etching having high chemical etching property is used to remove the damaged layer 8, the etching rate is higher in a portion where crystal distortion occurs, and the etching rate is lower in a portion where no crystal distortion occurs. Accordingly, in the case of using dry etching having high chemical etching property, a deeper polishing mark is generated and white turbidity occurs on the etching surface (see 8' of FIG. 4D). Accordingly, the adhesion of the etching mask is lowered, and, as illustrated in FIG. 4I, the ink supply port 12 may be formed into an abnormal shape. Particularly in the case of using a polyamide resin as the material for the etching mask, the adhesion of the etching mask is lowered.

(Second Embodiment)

FIGS. 2A to 2K are cross-sectional views illustrating the steps of an exemplary method of producing an ink jet head substrate according to a second embodiment of the present invention.

Figure 2A:
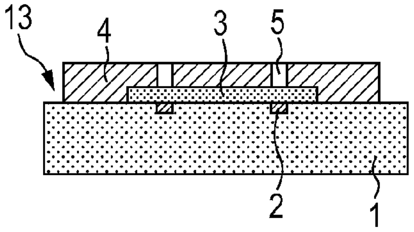
FIGS. 2A, 2B, 2C, 2D, 2E, 2F, 2G, 2H, 2I, 2J and 2K are cross-sectional views illustrating the steps of a method of producing a liquid ejection head substrate according to a second embodiment of the present invention.

First, as illustrated in FIG. 2A, a silicon substrate 1 on which ejection energy generating elements 2 are formed on the first surface (front surface) is prepared. Then, on the silicon substrate 1, a flow path pattern member 3 to be a pattern of the ink flow path is formed using a positive type resist or the like. Further, a flow path forming member 4 is formed on the flow path pattern member 3, and ink ejection orifices 5 are formed in the flow path forming member 4. A dicing saw line 13 is a cutting line. The silicon substrate is diced along the dicing saw line 13 in a post-process.

Figure 2B:
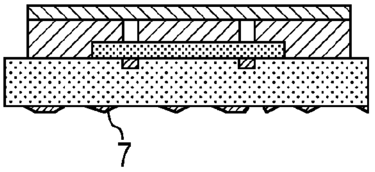

FIG. 2B illustrates the state after the step of FIG. 2A, in which a protective film 6 is formed and a second surface (rear surface) of the silicon substrate 1 on the opposite side of the first surface is subjected to grinding. A crushed layer 7 or a grinding mark (not shown) is generated on a ground surface of the silicon substrate 1.

Figure 2C:
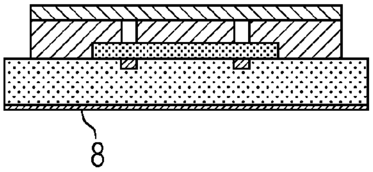
Figure 2D:
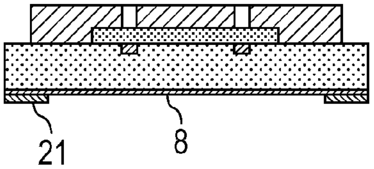

FIG. 2C illustrates the state after the step of FIG. 2B, in which the crushed layer 7 or the grinding mark is removed by polishing. The crushed layer 7 or the grinding mark is removed by polishing, and thus the ground surface is flattened. On the other hand, a damaged layer 8 including crystal distortion and polishing marks is generated on the silicon substrate surface after polishing (polished surface). An example of the polishing includes dry polishing FIG. 2D illustrates the state after the step of FIG. 2C, in which a positive type resist 21 is disposed in a region opposed to the dicing saw line 13 that is disposed on the function element forming surface, namely the polished surface. The positive type resist 21 can be formed using photolithography technology.

Figure 2E:
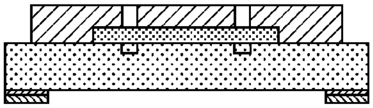

FIG. 2E illustrates the state after the step of FIG. 2D, in which the polished surface is etched by reactive ion etching using ion incident energy, with the positive type resist 21 used as a mask, to thereby remove the damaged layer 8. As the reactive ion etching using ion incident energy, inductive coupled plasma-RIE (ICP-RIE) can be used, for example.

Figure 2F:
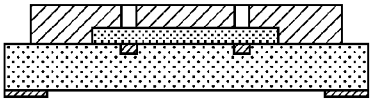

FIG. 2F illustrates the state after the step of FIG. 2E, in which the positive type resist 21 as a mask is removed by a remover liquid. A pattern made of the damaged layer 8 is formed at a position that is opposed to the dicing saw line 13 via the silicon substrate.

It is preferred that the damaged layer 8 be formed by a pattern that is larger than the width of the dicing saw line 13, and it is more preferred that the damaged layer 8 be formed to be larger than the width of the dicing saw line 13 by 30 μm or more on both sides of the dicing saw line 13.

The damaged layer 8 remains unremoved on the rear surface side of the silicon substrate 1 in the region opposed to the dicing saw line 13, and hence it is possible to suppress fracture of silicon that otherwise occurs by friction of a dicing say during cutting.

Figure 2G:
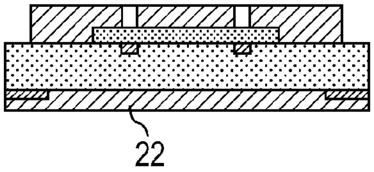

FIG. 2G illustrates the state after the step of FIG. 2F, in which a polyamide resin 22 is disposed on the second surface (rear surface) and the damaged layer 8 of the silicon substrate. The polyamide resin 22 can be disposed on the substrate rear surface by spin coating application and drying, for example.

Figure 2H:
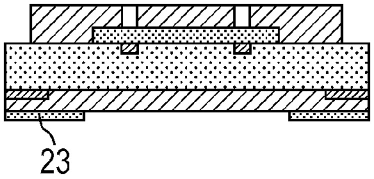

FIG. 2H illustrates the state after the step of FIG. 2G, in which a mask 23 is formed on the polyamide resin 22 by using a positive type resist.

Figure 2I:
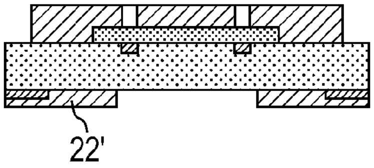

FIG. 2I illustrates the state after the step of FIG. 2H, in which the polyamide resin 22 is patterned using the mask 23 to form an etching mask 22'. The patterning of the polyamide resin 22 can be performed by etching using a dry etcher, for example. The mask serves as an etching mask 22' for forming an ink supply port 12. The silicon substrate surface of the etching mask 22' is the etching start surface.

Figure 2J:
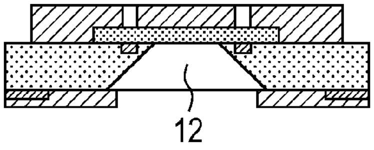
Figure 2K:
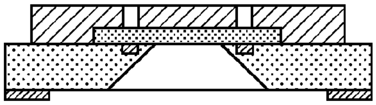
Figure 3A:
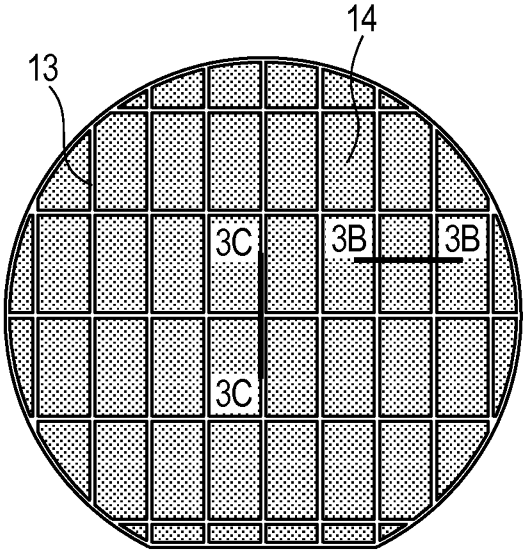
FIGS. 3A, 3B and 3C are a top view and cross-sectional views, respectively, illustrating an entire substrate and a dicing line pattern in the second embodiment of the present invention.
Figure 3B:
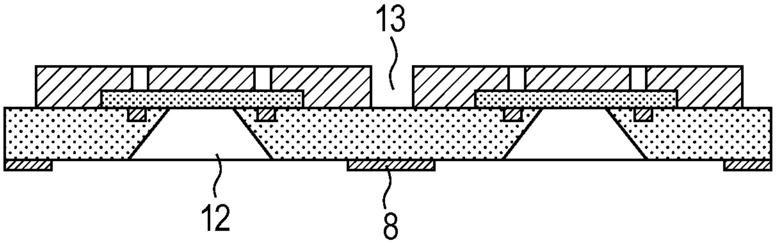
Figure 3C:
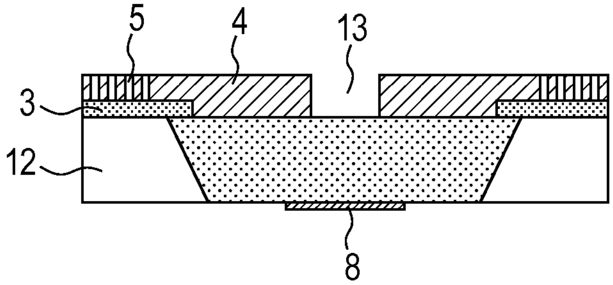

FIG. 2J illustrates the state after the step of FIG. 2I, in which the ink supply port 12 is formed by performing etching using the etching mask 22'.

When a silicon substrate with a <100> surface is used, the ink supply port 12 formed by crystal anisotropic etching is shaped so as to be reduced in area with an inclination angle of about 54.7° from an etching start surface toward an etching end surface. It is therefore desired to take this point into account when making pattern design of the etching mask.

Crystal anisotropic etching may use a TMAH 22 wt % solution as an example and may be performed at an etchant temperature of 80° C. for a given time period. In this case, the function element surface side is protected using a jig or protective means so as not to contact with the etchant. In the case of using the protective means in the step of polishing, by selecting an etching-resistant material as the protective means, the protective means can remain unremoved even after the completion of the polishing step and continue to function in the anisotropic etching step. The process can thus be simplified. As the protective means, protective tape can be used, for example.

After the ink supply port 12 is formed, the flow path pattern member 3 is dissolved and removed. In this manner, the main steps of producing an ink jet recording head is completed.

It is desired to use a silicon substrate with a crystal orientation of <100>, but a silicon substrate with a crystal orientation of <110> may also be used. In the case of using a silicon substrate with a <100> surface, a hole having a taper angle of 54.7° relative to the substrate surface is formed. In the case of using a silicon substrate with a <110> surface, a hole having an angle of 90° relative to the substrate surface, namely a perpendicular hole, is formed.

Crystal anisotropic etching of silicon may use a TMAH solution as an example, but a KOH solution may also be used instead of the TMAH solution.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

REFERENCE SIGNS LIST

1 silicon substrate
2 ejection energy generating element
3 flow path pattern member
4 flow path forming member
5 ejection orifice
6 protective film (or protective tape)
7 crushed layer
8 damaged layer
10 polyamide resin
10' second mask (etching mask)
11 positive type resist
11' first mask
12 ink supply port
13 dicing saw line
14 function element surface
21 positive type resist
22 polyamide resin
22' etching mask Effect of the Invention According to the present invention, there may be provided a method of producing a liquid ejection head substrate, which is capable of satisfactorily removing a damaged layer on a silicon substrate surface so as to improve covering property of an etching mask and is thus capable of forming a liquid supply port with high precision.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-023736, filed Feb. 7, 2011, which is hereby incorporated by reference herein in its entirety.

What is claimed is:

1. A method of producing a liquid ejection head substrate comprising a silicon substrate having a liquid supply port, the method comprising, in sequence, the steps of:

preparing the silicon substrate;

grinding a second surface of the silicon substrate, wherein the second surface is on a side opposite to a first surface side of the silicon substrate;

polishing the ground second surface;

etching the polished second surface by reactive ion etching using ion incident energy;

forming an etching mask on the second surface after the reactive ion etching; and forming the liquid supply port by subjecting the silicon substrate to wet etching using the etching mask, wherein the method further comprises a step of forming a member having an ejection orifice on the first surface side after the step of preparing the silicon substrate.

2. The method of producing a liquid ejection head substrate according to claim 1, wherein the etching of the polished second surface comprises etching, by the reactive ion etching, the second surface at least at a position at which the liquid supply port is to be formed.

3. The method of producing a liquid ejection head substrate according to claim 1, wherein the reactive ion etching comprises a method of causing ions generated using plasma to impinge on the second surface.

4. The method of producing a liquid ejection head substrate according to claim 1, wherein the reactive ion etching uses, as a gas species, at least one kind selected from $SF_6$, $CHF_3$, $CF_4$, $C_2F_6$, and $C_3F_8$.

5. The method of producing a liquid ejection head substrate according to claim 1, wherein the etching mask is formed of a film including a polymer compound.

6. The method of producing a liquid ejection head substrate according to claim 5, wherein the polymer compound comprises one of cyclized rubber, polyether amide, and benzocyclobutene.

7. The method of producing a liquid ejection head substrate according to claim 1, wherein the wet etching comprises crystal anisotropic etching.

8. The method of producing a liquid ejection head substrate according to claim 1, further comprising, after the polishing of the ground second surface and before the etching of the polished second surface, a step of forming a mask at least in a region opposed to a cutting line that is provided on the first surface side and is used for cutting the silicon substrate, wherein the etching of the polished second surface comprises, after performing the reactive ion etching using the mask, removing the mask so that a damaged layer remains unremoved in the region opposed to the cutting line.

9. The method of producing a liquid ejection head substrate according to claim 1, wherein the member is formed on the first surface side of the silicon substrate before the grinding of the second surface of the silicon substrate.

* * * * *